United States Patent
Musa et al.

(10) Patent No.: US 7,460,231 B2
(45) Date of Patent: Dec. 2, 2008

(54) ALIGNMENT TOOL FOR A LITHOGRAPHIC APPARATUS

(75) Inventors: Sami Musa, Eindhoven (NL); Richard Johannes Franciscus Van Haren, Waalre (NL); Maurits Van Der Schaar, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 156 days.

(21) Appl. No.: 11/389,494

(22) Filed: Mar. 27, 2006

(65) Prior Publication Data
US 2007/0222990 A1    Sep. 27, 2007

(51) Int. Cl.
*G01B 11/00* (2006.01)
(52) U.S. Cl. .................. 356/401; 356/521; 356/499
(58) Field of Classification Search .................. 356/499, 356/509, 508, 521, 401
See application file for complete search history.

(56) References Cited

U.S. PATENT DOCUMENTS

| | | | | |
|---|---|---|---|---|
| 3,738,753 A | * | 6/1973 | Huntley, Jr. ................. | 356/457 |
| 5,977,539 A | * | 11/1999 | Holzapfel et al. ........ | 250/237 G |
| 6,005,667 A | * | 12/1999 | Takamiya et al. ........... | 356/499 |
| 6,297,876 B1 | * | 10/2001 | Bornebroek .................. | 355/67 |
| 7,050,675 B2 | * | 5/2006 | Zhou ........................... | 385/37 |
| 2007/0114678 A1 | * | 5/2007 | Van Haren et al. .......... | 257/797 |

FOREIGN PATENT DOCUMENTS

WO    98/39689    9/1998

OTHER PUBLICATIONS

P. Lalanne et al., "Design and Fabrication of Blazed Binary Diffractive Elements with Sampling Periods Smaller than the Structural Cutoff," Optical Society of America (1999), Josa A, vol. 16, Issue 5, pp. 1143-1156.

* cited by examiner

*Primary Examiner*—Tarifur Chowdhury
*Assistant Examiner*—Michael Lapage
(74) *Attorney, Agent, or Firm*—Pillsbury Winthrop Shaw Pittman LLP

(57) ABSTRACT

An alignment tool for a lithographic apparatus illuminates an alignment mark on a substrate with an alignment beam and measures the reflected spectrum. The reflected spectrum is compared with a reference mark to determine any misalignment. A blazed sub-wavelength grating is used to deflect the sub-beams created by diffracting the alignment beam from the alignment mark onto the reference mark.

7 Claims, 4 Drawing Sheets

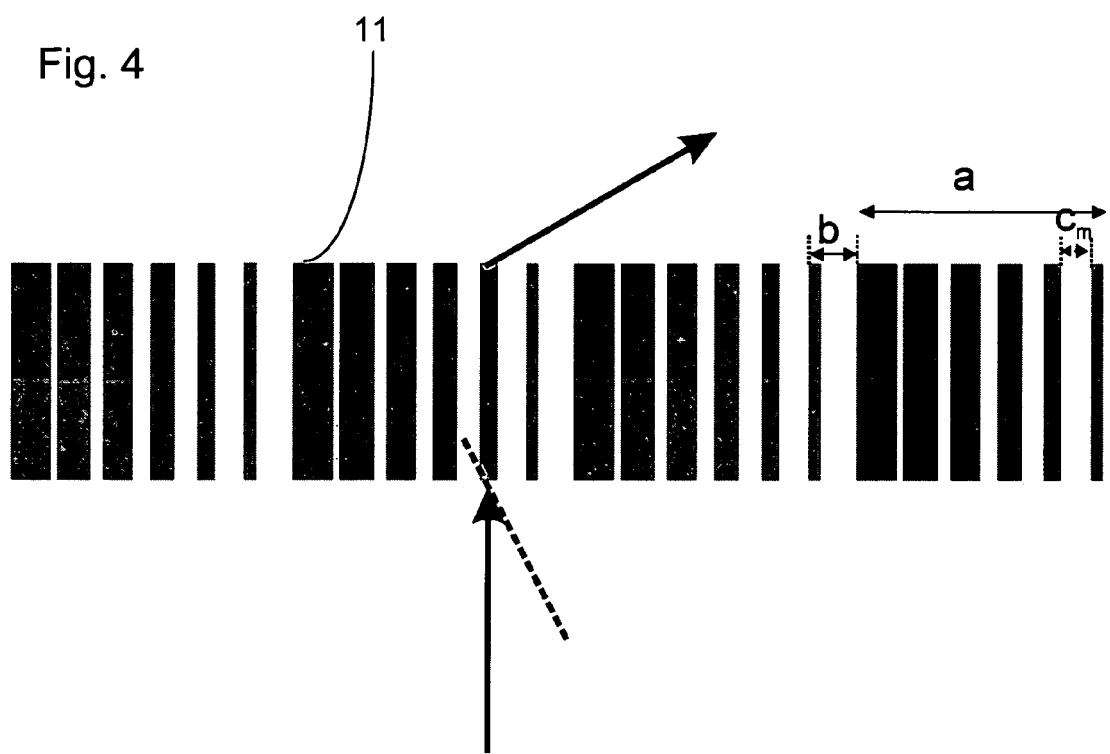

ALIGNMENT TOOL FOR A LITHOGRAPHIC APPARATUS

FIELD

The present invention relates to a lithographic apparatus and a method for manufacturing a device. In particular, it refers to the alignment of exposure layers on a substrate.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A number of different patterns may be successively imaged at the same position on a semiconductor substrate. The substrate must undergo the desired physical and chemical changes between the successive images at the same position. To this end, the substrate must be removed from the apparatus after it has been exposed with a pattern, and, after it has undergone the desired process steps, the substrate must be replaced at the same position again so as to expose it with a second pattern, and so forth. Meanwhile, it must be ensured that the images of the second pattern and the subsequent patterns are positioned accurately with respect to the substrate. To this end, the lithographic projection apparatus is provided with an optical alignment system with which alignment marks on the substrate are aligned with respect to alignment marks on the patterning device (such as a mask).

In other words, before exposing the substrate, that substrate must be correctly aligned with respect to the rest of the system. An alignment mark is provided on the substrate and detected with an alignment system as discussed below.

A known alignment system is disclosed in WO 98/39689 and employs an alignment beam of radiation that is radiated by a separate alignment unit and that is incident on a mark, in the form of a grating, on the substrate. The grating diffracts the alignment beam into a number of sub-beams extending at different angles to the normal of the grating. Said distinct sub-beams will be directed with a lens of the alignment unit to different positions in a plane. In this plane, means may be provided for further separating the different sub-beams. The lens system will also be used finally to image the different sub-beams on a reference plate to create an image of the mark. In this reference plate, a reference mark can be provided and a radiation sensitive detector can be arranged behind the reference mark. The sub-beams may be diffracted by the reference mark to contain information about the alignment mark position with respect to the reference mark. The output signal of the detector will be dependent on the extent to which the image of the substrate mark and the reference mark coincide. In this way, the extent of alignment of the mark on the substrate with the reference mark in the alignment unit can be measured and optimized. The detector may comprise separate individual detectors for measuring the intensity and the aligned position at different orders. To finish the alignment, the reference in the alignment unit has to be aligned to a second reference mark, for example, one provided to the substrate table with the alignment unit. This second reference mark may then be aligned to a mark in the mask (or other patterning device) using exposure light.

The reference consists of a structure of a number of separate reference elements equal to the number of diffraction orders used and having the same shape as the substrate alignment mark. A separate detector is associated with each of these elements for converting the sub-beam coming from the substrate mark and passed by the relevant diffractive reference element into an electric signal. The structure of deflection elements comprises a pair of deflection elements for each diffraction order to deflect the sub-beams of this diffraction order with opposed diffraction order signs such that the second lens system converges these sub-beams on one associated reference element.

The deflection elements in the known alignment system comprise beam deflectors in the form of wedges. Specifically, minus order and plus order diffracted sub-beams (caused by the diffraction of the alignment beam) must be combined before producing the alignment image to be compared with the reference mark. In order that the plus- and minus order sub-beams of the same diffraction order are deflected such that they can be correctly superposed by the second lens system on the associated reference grating, stringent requirements are to be set to the mutual quality of the two associated wedges. These quality requirements relate to the quality of the inclined faces of the wedges and to the wedge angles. Severe requirements are necessary for the wedges to be set to the mutual accuracy of, for example, the slope of the wedge surfaces of two wedges which are used for deflecting the +order and −order sub-beams of the same diffraction order.

Furthermore, a large number of individual wedges are required to combine the sub-beams. For example, three wedges may be used for each sub-beam to make the wedge angle preciseness more robust. A series of wedges is then required for each sub-beam and in both the X- and Y-directions.

Another disadvantage of wedges is that when using two wavelengths in the alignment beam, the number of wedges must double, which means that instead of 24 discrete wedges, 48 wedges must be used, for example, or that instead of 6 wedge-shaped plates, 12 of such plates must be used.

SUMMARY

In view of the above, a need exists to find a more robust, simpler and cheaper way to deflect the diffracted alignment beam.

Embodiments of the present invention provide an alignment system for a lithographic projection apparatus that is adapted to separately detect at least three sub-beams diffracted by the diffractive mark in different diffraction orders that are higher than 0, each sub-beam comprising an indication about the position of the substrate mark with respect to the reference.

According to an aspect of the invention, there is provided an alignment system wherein the wedges of known alignment systems are replaced with a blazed sub-wavelength grating.

Specifically, according to an aspect of the invention, there is provided an alignment system comprising:

at least one reference mark;

an illuminator configured to direct an alignment radiation beam onto a diffractive alignment mark on a substrate such that the alignment radiation beam is diffracted by the diffractive alignment mark into sub-beams, each with a different diffraction order;

a deflection element configured to deflect the sub-beams from the alignment mark to the at least one reference mark according to the diffraction order of the sub-beams, wherein the at least one reference mark is configured to diffract further the sub-beams such that each sub-beam comprises an indication of the position of the alignment mark with respect to said at least one reference mark; and a detector configured to inspect the sub-beams diffracted from said at least one reference mark in order to determine the position of the alignment mark with respect to the reference mark, wherein the deflection element comprises a sub-wavelength grating of structures with a distance between adjacent structures of less than the wavelength of the sub-beams.

According to another aspect of the invention, there is provided an inspection method for inspecting the alignment of a pattern on a substrate, comprising:

illuminating an alignment mark on the substrate with an alignment radiation beam such that the alignment radiation beam is diffracted into sub-beams with different diffraction orders, directing the sub-beams onto a deflection element comprising a sub-wavelength grating, the grating having a period less than the wavelength of the sub-beams such that the sub-beams are deflected onto at least one diffractive reference mark according to the diffraction order of the sub-beam;

wherein the sub-beams are further diffracted by the at least one reference mark such that the sub-beams contain an indication of the position of the alignment mark relative to the at least one reference mark; and inspecting the sub-beams diffracted by the at least one reference mark in order to determine the alignment between the alignment mark and the at least one reference mark.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4 depicts a sub-wavelength grating according to another embodiment of the invention.

DETAILED DESCRIPTION

Figure 1:
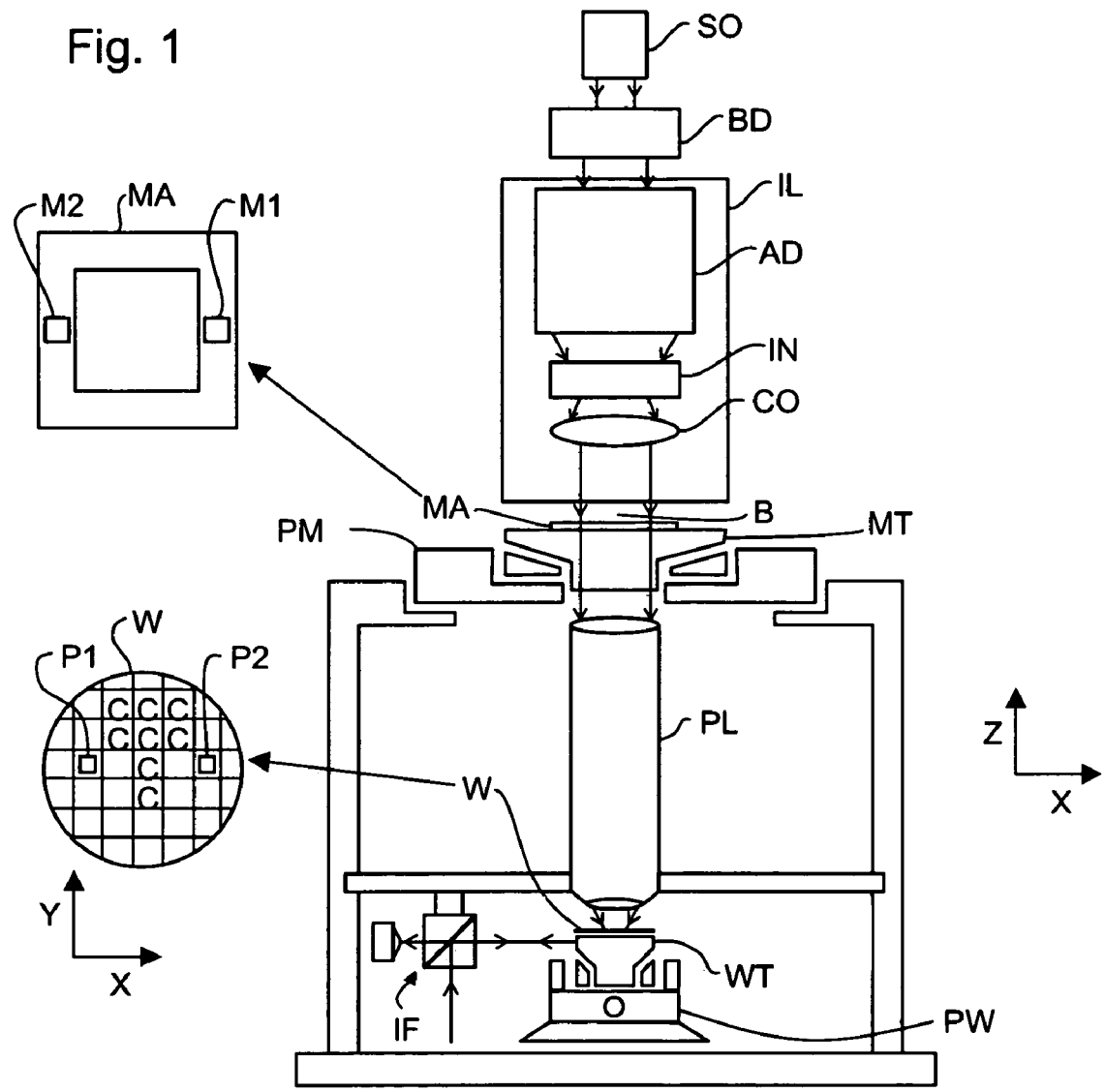
FIG. 1 depicts a lithographic apparatus according to an embodiment of the invention.

FIG. 1 schematically depicts a lithographic apparatus 1 according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

A known optical lithographic projection apparatus provided with an on-axis alignment unit and wedges as deflection elements is described in WO 98/39689, which is incorporated herein by reference.

The apparatus is provided with a number of measuring systems, namely a system for aligning the mask MA and the substrate W with respect to each other in the XY plane, an interferometer system for determining the position and orientation of the substrate holder and hence of the substrate, and a focus error detection system for determining a difference between the focal or image plane of the projection lens system PL and the surface of the substrate W. These measuring systems are parts of servo systems which comprise electronic signal-processing and control circuits and drivers, or actuators, with which the position and orientation of the substrate and the focusing can be corrected with reference to the signals supplied by the measuring systems.

The alignment system makes use of two alignment marks M1 and M2 in the mask MA shown in the top left part of FIG. 1. These marks preferably consist of diffraction gratings but may be alternatively constituted by other marks such as squares or strips, which are optically distinguished from their surroundings. The alignment marks are preferably two-dimensional, i.e. they extend in two mutually perpendicular directions, the X and Y directions. The substrate W, for example a semiconductor substrate, has at least two alignment marks, preferably also two-dimensional diffraction gratings, two of which, P1 and P2, are shown in FIG. 1. The marks P1 and P2 are situated outside the IC areas on the substrate W. The grating marks P1 and P2 are preferably implemented as phase gratings and the grating marks M1 and M2 are preferably implemented as amplitude gratings.

In an on-axis alignment unit such as that described in WO 98/39689, a double alignment unit in which two alignment beams depicted in FIG. 1 as B are used for aligning the substrate alignment mark P2 on the mask alignment mark M2, and for aligning the substrate alignment mark P1 on the mask alignment mark M1, respectively. The beam B is reflected by a reflecting element, for example a mirror, towards the reflecting surface of a prism. The surface reflects the beam B towards the substrate alignment mark P2, which sends a part of the radiation beam to the associated mask mark M2 where an image of the mark P2 is formed. Situated above the mark M2 is a reflecting element, for example a prism, which directs the radiation passed by the mark M2 towards a radiation-sensitive detector.

The second alignment beam of B is reflected by a mirror towards a reflector in the projection lens system PL. This reflector sends the beam B to a second reflecting surface of the prism, which surface directs the beam B onto the substrate alignment mark P1. This mark reflects a part of the radiation of the beam B to the mask alignment mark M1 where an image of the mark P1 is formed. The radiation of the beam passing through the mark M1 is directed by a reflector towards another or the same radiation sensitive detector.

A deflection element, such as the sub-wavelength grating described later, may be arranged in the path of the alignment beam(s) proximate to an alignment mark. With such a deflection element, alignment errors resulting from unintentional phase differences within the selected alignment beam portions received by the radiation sensitive detector(s) may be prevented, which phase differences may occur if the axis of symmetry of the alignment beam portions coming from a substrate alignment mark is not perpendicular to the mask plate, so that false reflections may occur within this plate.

Figure 2:
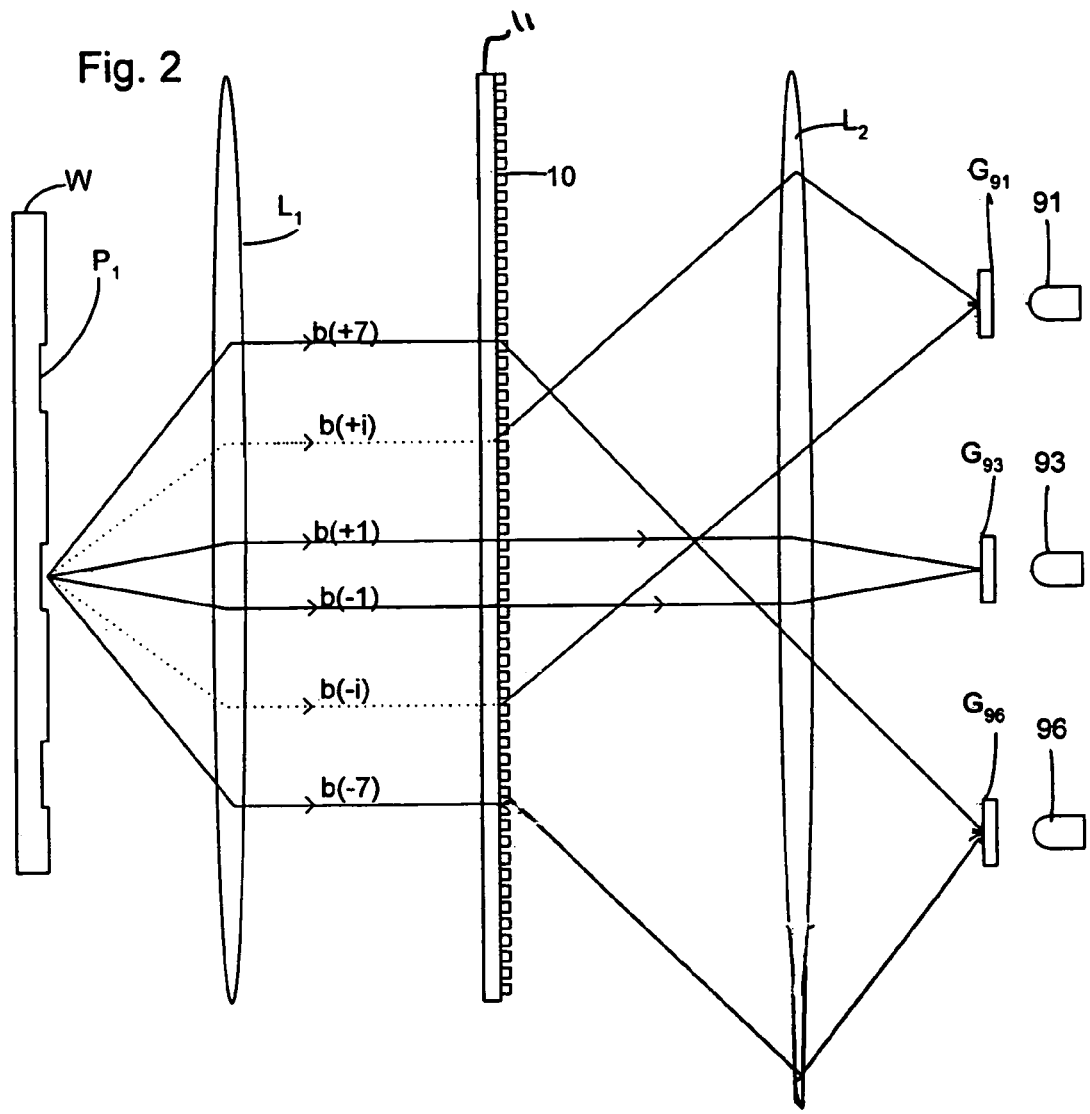
FIG. 2 depicts part of an alignment tool according to an embodiment of the invention.

In FIG. 2, a substrate mark, in the form of a grating, is denoted by $P_1$. A parallel alignment beam b (not shown) having a wavelength λ incident on this grating is split up into a number of sub-beams extending at different angles $α_n$ to the normal on the grating, which angles are defined by the known grating formula:

$$\sin α_n = (N\lambda)/P \qquad (1)$$

wherein N is the diffraction order number and P the grating period.

The path of the sub-beams reflected by the grating incorporates a lens system $L_1$ which converts the different directions of the sub-beams into different positions $u_n$ of these sub-beams in a plane. The position $u_n$ is given by $$u_n = f_1 α_n \qquad (2)$$

wherein $f_1$ is the focal length of the lens system $L_1$.

In this plane, means are provided for further separating the different sub-beams. To this end, a plate may be arranged in this plane, which is provided with deflection elements in the form of a blazed sub-wavelength grating. In FIG. 2, the sub-wavelength grating is denoted by 10.

A second lens system $L_2$ with a focal length $f_2$ is arranged behind the sub-wavelength grating 10. This lens system images the mark $P_1$ in the plane reference plates (G). In the absence of the sub-wavelength grating, all sub-beams would be superimposed in the reference plane. Since the different sub-beams passing through the wedge plate 11 are deflected at different angles, the images formed by the sub-beams reach different positions in the reference plane. These positions $X_n$ are given by $$X_n = f_2 \gamma_n \qquad (3)$$

in which γ is the angle at which a sub-beam is deflected by wedge plate 11.

At these positions, reference gratings $G_{91}$, $G_{93}$ and $G_{96}$ can be provided, as is shown in FIG. 2. A separate detector 91, 93 and 96 is arranged behind each of respective reference gratings $G_{91}$, $G_{92}$ and $G_{96}$. The output signal of each detector is dependent on the extent to which the image of the substrate grating $P_1$ coincides with the relevant reference grating. Hence, the extent of alignment of the substrate grating, and thus of the substrate, can be measured with each detector 91, 93 and 96. However, the accuracy with which the measurement takes place is dependent on the order number of the sub-beam used; when this order number is larger, the accuracy is greater. In FIG. 2, it has been assumed for the sake of simplicity that all reference gratings $G_{91}$, $G_{93}$ and $G_{96}$ have the same grating period. Actually, however, the grating period of each grating is adapted to the order number of the associated sub-beam. As the order number increases, the grating period decreases and a smaller alignment error can be detected.

Hitherto only one set of diffraction orders has been considered. As is known, a diffraction grating forms, in addition to +1, +2, +3 etc. order sub-beams, also sub-beams of diffraction orders −1, −2, −3 etc. Both the plus orders and the minus orders sub-beams can be used to form the grating image, i.e. a first image of the grating mark is formed by the +1 and −1 order sub-beams jointly, a second image is formed by the +2 and −2 order sub-beams jointly, and so forth.

In FIG. 2, for clearness' sake, only the sub-beams of the first orders b(+1) and b(−1), the sub-beams of the seventh order b(+7) and b(−7) and the sub-beams of another order b(+i) and b(−i), for example the fifth order, are shown. As FIG. 2 illustrates, the sub-wavelength grating is such that the sub-beams b(+7) and b(−7) are deflected in parallel directions and converged by the second lens system on one reference grating $G_{96}$. Also the sub-beams b(+i) and b(−i) are deflected by the sub-wavelength grating in parallel directions and converged on one reference grating $G_{91}$. The first order sub-beams are not necessarily deflected and are converged by the second lens system on one reference grating $G_{93}$. By using both the plus order and the minus order of each diffraction order, a truthful image of the substrate grating mark $P_1$ is formed on the associated reference grating and a maximum use is made of the available radiation. Once diffracted by the reference gratings, the sub-beams contain information about the alignment mark position with respect to the reference mark position and may be detected by detectors 91, 93 and 96 respectively for the relative positions to be inspected and compensated for if there is a misalignment.

The present invention uses the fact that the exposure wavelength used by the lithographic apparatus is much smaller than the alignment wavelength λ.

An alignment wavelength may be infra-red or visible light, for example; LSA 633 nm or FIA 560-630 nm; or radiation from an HeNe laser or Halogen lamp (i.e. any wavelength that will not affect the resist layers on the substrate), while an exposure wavelength is usually ultra-violet or similar.

Sub-wavelength periodic 2-D arrays of structures may be created as the deflection element that will deflect the suborders of the alignment beam. Such periodic 2-D arrays act as artificial crystals for the alignment wavelength. The microscopic optical properties of such a crystal, for example, the effective real and imaginary parts of the refractive index, can be controlled accurately by the shape of the structure and the periodicity of the 2-D arrays. This means that the macroscopic optical properties of the optical element may be tailored for the alignment wavelength. In particular, the alignment beam is deflected onto the specific detectors $G_{91}$, $G_{93}$ and $G_{96}$ with a specific spectrum and at specific deflection angles as required. The optical properties for the wavelength of the alignment beam are controlled by making use of the imaging capabilities of the wavelength of the exposure beam.

Figure 3:
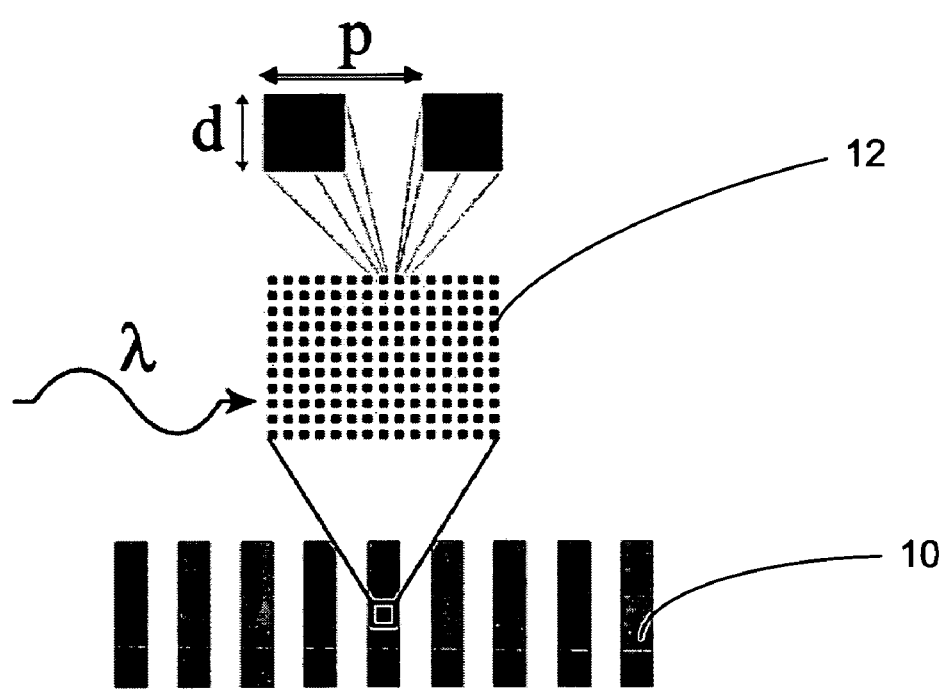
FIG. 3 depicts a sub-wavelength grating according to an embodiment of the invention.

The present invention as shown in FIGS. 3 and 4 refers to the use of blazed sub-wavelength gratings 10 as beam deflectors instead of wedges in the alignment tool of the prior art. Blazed transmission gratings 10 function as sub-beam deflectors that are capable of steering an incident beam into a wide range of deflection angles in any offset direction depending on the grating periods. Highly efficient blazed gratings can be realized using sub-wavelength segmentation 12 of the gratings. The blazing effect can be achieved by sub-segmenting the period of the grating into smaller sub-wavelength periods p and by varying the duty cycles of these sub-wavelength periods as described later and shown in FIG. 4. By changing the duty cycle, the effective refractive index within the grating periods can be linearly varied and a liner change in the local phase within the period from 0 to $\pi$ is obtained.

Furthermore, sub-wavelength blazed gratings, operating in the alignment wavelength range of greater than 500 nm can be easily fabricated on a glass substrate using optical lithography or conventional reticle writing equipment.

FIG. 3 shows an example of an optical element based on a two-dimensional photonic crystal. In this embodiment, the dark columns 10 are made up of 2-D arrays 12 of contact holes in, for example, a glass substrate. A structure used in array 12 can be any repetitive feature that forms an artificial crystal for the wavelength of the alignment beam (1-D or 2-D). In practice, it is likely that the feature will be a contact hole. It may also be a "brick" like structure such as that used in deep trench applications. For instance, in a copper damascene process, arrays of holes are printed, etched in Silicon-Oxide and filled with copper. The excess copper is polished away.

In one embodiment of the present invention, both the feature size d and the pitch p of the array as shown in FIG. 3 are much smaller than the wavelengths of the alignment beam $\lambda$. In preferred embodiments of the present invention, pitch p is smaller than the wavelength of the alignment beam, whereas feature size d may optionally be smaller. By making these structures, or contact holes, smaller than the alignment beam wavelength, but larger than the exposure beam wavelength, artificial materials are created with controlled optical properties. The optical properties may be the real (refractivity or reflectivity) and imaginary (absorption) part of the effective refractive index. Artificial materials with controlled optical properties for the alignment wavelengths can be made by making use of lithographic techniques, i.e. when these alignment techniques are used in lithography, the lithographic apparatus itself may be used to create the optical elements. By using structures (blazed grating period) smaller than the wavelength of alignment sub-beams, the incident light will not be able to resolve these features and therefore will see the structure as a homogenous medium. This homogenous medium will have an effective refractive index (both real and imaginary) that is dependant on the refractive indices of the material making up the structure and the geometry of the structure (i.e. the period and duty cycle.)

By making use of 2-D periodic arrays, the optical properties of resulting material can be made isotropic for the wavelength of the alignment beam. The polarization sensitivity depends on the geometry of the structures, which are generally symmetrical features, such as squares and circles, and which lead to marks that are polarization insensitive.

The document "Optimized Artificial Index Gratings" on pages 915-921 of Infrared phys. technol. 36 (1995) by M. Collischon et al. describes artificial index gratings that are binary gratings consisting of minilattices of sub-wavelength microstructures. The document describes the use of a metallic or dielectric sub-wavelength grating that, thanks to its arrays of sub-wavelength microstructures, gives rise to the material containing the grating having an overall "effective" refractive index. This effective refractive index causes the microstructures to behave like material with distributed index. The benefit of this sort of structure is that the periodicity and duty cycle of the structure can be made so that, depending on the incident alignment wavelength, only the zeroth diffraction order is detectable and the rest of the diffraction orders are evanescent. In this way, all the incident energy can be transmitted or reflected in the zeroth order with almost 100% efficiency. By changing the duty cycle of the sub-segments or microstructures, the local phase within the grating period can be controlled and consequently, the direction of the light transmitted or reflected from the grating can be varied. This means that it is much easier to focus the alignment beam onto the alignment mark using a sub-wavelength grating as a beam deflector.

FIG. 4 shows an example of the organization of the structures in the grating according to an embodiment of the present invention. The size of the structures 11 varies linearly from one end of the array of structures to the other (i.e. the phase, which is proportional to the refractive index of the structures varies from one end of the array to the other). However, the distance from the left edge of one structure to the left edge of the next structure (the sub-wavelength pitch) is constant and is labeled as a distance b. The grating period (i.e. from a minimum to a maximum of the period) is labeled as a and the varying distance between the structures 11 is labeled as $c_m$, where m is the number of the individual structure 11.

The duty cycle, $t_m$, is defined as:

$$t_m = (b - c_m)/b \quad (4)$$

By varying the duty cycle $t_m$ of the sub-segments so as to create a linearly varying local phase within the grating period, a blazed grating is created using only binary sub-wavelengths structures and all the incident light will be reflected into the single order that is characteristic to the grating period.

Another term for these periodic two-D arrays is "artificial crystals". The microscopic optical properties of these crystals, for example the effective real and imaginary part of the refractive index (the "effective index") can be controlled accurately by the duty cycle $t_m$ and the periodicity a of the arrays. The microscopic optical properties of the optical element may therefore be tailored for the alignment wavelength thanks to the microscopic optical properties.

Using sub-wavelength blazed gratings as beam deflectors leads to more robust and compact alignment tools. The deflectors can also be cheaply fabricated and easily installed and aligned to the rest of the alignment tool. The deflection angles are furthermore realized with extremely high precision.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers. It is important to ensure that each time the exposure beam is projected onto the substrate, that it is aligned with the pattern already existing on the substrate. In order to do this, alignment marks are present in each of the layers of resist, and the exposure is carried out by an exposure beam once an alignment beam projected from the same projection system has used the alignment marks to ensure that the projection system and patterning means is aligned with the substrate and with the existing pattern (and alignment marks) on the substrate.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

We claim:

1. An alignment tool comprising:
   at least one reference mark;
   an illuminator configured to direct an alignment radiation beam onto a diffractive alignment mark on a substrate such that the alignment radiation beam is diffracted by the diffractive alignment mark into sub-beams, each sub-beam having a different diffraction order;
   a deflection element configured to deflect the sub-beams from the alignment mark to the at least one reference mark according to the diffraction order of the sub-beams, wherein the at least one reference mark is configured to further diffract the sub-beams such that each sub-beam comprises an indication of a position of the alignment mark with respect to said at least one reference mark; and
   a detector configured to inspect the sub-beams diffracted from said at least one reference mark in order to determine the position of the alignment mark with respect to the at least one reference mark, wherein the deflection element comprises a sub-wavelength grating of structures, wherein a distance between adjacent structures is less than the wavelength of the sub-beams.

2. An alignment tool according to claim 1, wherein the sub-wavelength grating comprises a periodic array of structures, the structures being separated by a distance that is less than the wavelength of said sub-beams.

3. An alignment tool according to claim 2, wherein a width of the structures varies within a period such that a phase of the structure varies linearly from a first end of the periodic array to a second end of the periodic array.

4. An alignment tool according to claim 2, wherein a duty cycle, defined as $(b-c_m)/b$, where $c_m$ is a distance between adjacent structures m and m+1 and b is an array period, varies such that the sub-wavelength grating has a linearly varying phase from a first end of the array to a second end of the periodic array.

5. An alignment tool according to claim 2, wherein the distance between adjacent structures of the periodic array is constant from a first end of the periodic array to a second end of the periodic array.

6. An alignment tool according to claim 1, wherein the sub-wavelength grating is blazed.

7. An inspection method for inspecting an alignment of a pattern on a substrate, comprising:
   illuminating an alignment mark on the substrate with an alignment radiation beam such that the alignment radiation beam is diffracted into sub-beams having different diffraction orders;
   directing the sub-beams onto a deflection element comprising a sub-wavelength grating, the sub-wavelength grating having a period less than a wavelength of the sub-beams, such that the sub-beams are deflected onto at least one diffractive reference mark according to a diffraction order of the sub-beam, wherein the sub-beams are further diffracted by the at least one reference mark such that the sub-beams contain an indication of the position of the alignment mark relative to the at least one reference mark; and
   inspecting the sub-beams diffracted by the at least one reference mark in order to determine alignment between the alignment mark and the at least one reference mark.

* * * * *